United States Patent [19]
Humphreys et al.

[11] Patent Number: 5,493,715
[45] Date of Patent: Feb. 20, 1996

[54] MULTI-RANGE VOLTAGE CONTROLLED RESONANT CIRCUIT

[75] Inventors: Scott R. Humphreys; Robert M. Gorday, both of Boynton Beach, Fla.

[73] Assignee: Motorola, Inc., Schaumburg, Ill.

[21] Appl. No.: 283,329

[22] Filed: Aug. 1, 1994

[51] Int. Cl.$^6$ .................... H04B 1/16; H03B 5/00
[52] U.S. Cl. ............ 455/264; 455/197.2; 455/262; 331/177 V; 334/78
[58] Field of Search ................ 455/180.4, 191.2, 455/193.2, 193.3, 197.2, 197.3, 261, 262, 264, 76; 331/36 C, 177 V, 179; 333/174, 175; 334/78, 47, 55, 59, 60, 64, 15

[56] References Cited

U.S. PATENT DOCUMENTS

| | | | |
|---|---|---|---|
| 3,947,772 | 3/1976 | Sato | 455/262 |
| 4,973,922 | 11/1990 | Embree et al. | 333/177 V |
| 5,027,429 | 6/1991 | Kojima | 455/264 X |
| 5,160,902 | 11/1992 | Saeki et al. | 331/177 V |
| 5,166,646 | 11/1992 | Avanic et al. | 331/107 |
| 5,166,857 | 11/1992 | Avanic et al. | 361/280 |
| 5,173,835 | 12/1992 | Cornett et al. | 257/310 |
| 5,254,958 | 10/1993 | Flach et al. | 331/177 V |
| 5,319,800 | 6/1994 | Erbora et al. | 455/78 |

Primary Examiner—Chi H. Pham
Attorney, Agent, or Firm—James A. Lamb

[57] ABSTRACT

A voltage controlled tunable resonant circuit (100) has at least two resonant frequency ranges and reduced self modulation, and includes a resonant element (120), a variable reactance element (130), and a first voltage variable capacitor (VVC) (150). The variable reactance element (130) is coupled to the resonant element (120). The VVC (150) has two fixed capacitance values corresponding to two fixed capacitance bias voltage ranges, and is coupled to the resonant element (120) and the variable reactance element (130). The first VVC (150) is controlled by a first DC bias voltage (190) selected to be within one of the two fixed capacitance bias voltage ranges to establish one of the two resonant frequency ranges over which the voltage controlled tunable resonant circuit (100) is tuned by variation of the variable reactance element (130).

7 Claims, 5 Drawing Sheets

MULTI-RANGE VOLTAGE CONTROLLED RESONANT CIRCUIT

FIELD OF THE INVENTION

This invention relates in general to electronic networks having resonant circuits and in particular to networks having voltage controlled resonant circuits.

BACKGROUND OF THE INVENTION

Radio receivers and transmitters designed for use in selective call radio communication systems, such as paging systems, are often designed to have resonant frequency circuits, such as voltage controlled oscillators (VCOs) and tunable filters, which have controllable resonant frequency characteristics. A common design for VCO's includes one voltage variable tuning element having a variable reactance, used in a resonant, or tank, circuit having at least one fixed resonant element having a fixed reactance value, wherein a control voltage is impressed across the voltage variable tuning element to set a reactance value of the voltage variable tuning element. The resonant circuit is coupled to an amplifier and an oscillation voltage is generated which is impressed across each of the reactive elements. A commonly used fixed resonant element is an inductor. A commonly used voltage variable element is a varactor diode. A varactor diode has a voltage controllable capacitance which is variable over a capacitance range of approximately 2 to 1. The voltage controllable capacitance is controlled by a bias voltage, which is typically varied across an operational range of 0 to approximately 2 or 3 volts.

The resonant frequency tuning range of the VCO is determined, among other things, by the reactance values of the fixed elements and the range of the reactance of the variable tuning element. Because the reactance of the variable tuning element in a VCO is sensitive to voltage changes, VCO's typically have an inherent problem of generating undesirable side-band noise which is partially caused by a phenomenon known as self-modulation. This phenomenon of self-modulation is caused by the bias voltage being modulated by the oscillation voltage. The resulting modulated bias voltage induces the undesirable side-band noise in the oscillation voltage. The self-modulation effect can be reduced by reducing the sensitivity of the variable reactance element to changes of the bias voltage, but this results in a narrower frequency range of the VCO.

One approach to providing a desired tuning range while using a low sensitivity variable reactance element is to use the low sensitivity variable reactance element in combination with one or more fixed amounts of reactance, such as capacitors which are switched into or out of the resonant circuit. This, in effect, gives two or more tuning ranges which can be tuned by the one variable reactance element. These ranges can be overlapped to achieve the desired total tuning range. Approaches using PIN diodes, field effect transistor switches and additional varactors have been used, but they have one or more of the drawbacks of requiring additional current drain, additional control and ground connections, additional parts, and can also increase side-band noise.

Thus, what is needed is a simpler circuit for providing frequency networks having a wide tuning range with less side band noise and lower current drain in portable and mobile radios.

SUMMARY OF THE INVENTION

Accordingly, in a first aspect of the present invention, a voltage controlled tunable resonant circuit has at least two resonant frequency ranges and reduced self modulation, and includes a resonant element, a variable reactance element, and a first voltage variable capacitor (VVC). The variable reactance element is coupled to the resonant element. The VVC has two fixed capacitance values corresponding to two fixed capacitance bias voltage ranges, and is coupled to the resonant element and the variable reactance element. The first VVC is controlled by a first DC bias voltage selected to be within one of the two fixed capacitance bias voltage ranges to establish one of the two resonant frequency ranges over which the voltage controlled tunable resonant circuit is tuned by variation of the variable reactance element.

Accordingly, in a second aspect of the present invention, a selective call receiver is for receiving a radio signal which includes an address. The selective call receiver includes a receiver element, a controller, and a sensible alert. The receiver element is for receiving and demodulating the radio signal, including the address. The controller is coupled to the receiver element and is for comparing the address received in the radio signal with a predetermined address stored in the selective call receiver. The sensible alert is coupled to the controller and is responsive to the controller. The sensible alert is for presenting an alert indication when the address compares to the predetermined address. At least a portion of the receiver element and the controller includes a voltage controlled oscillator circuit operable within two or more resonant frequency ranges and having reduced self modulation. The voltage controlled oscillator circuit includes an amplifier having gain, and a voltage controlled tunable resonant circuit. The voltage controlled tunable resonant circuit has at least two resonant frequency ranges and includes a variable reactance element, a resonant element, and a first voltage variable capacitor (VVC). The variable reactance element is coupled to the resonant element. The VVC has two fixed capacitance values corresponding to two fixed capacitance bias voltage ranges. The first VVC is coupled to the resonant element and the variable reactance element. The first VVC is controlled by a first DC bias voltage selected to be within one of the two fixed capacitance bias voltage ranges to establish one of the two resonant frequency ranges over which the voltage controlled tunable resonant circuit is tuned by variation of the variable reactance element.

Accordingly, in a third aspect of the present invention, a voltage controlled tunable resonant circuit has at least two resonant frequency ranges and reduced self modulation. The voltage controlled tunable resonant circuit includes a resonant element, a varactor diode, and a first voltage variable capacitor (VVC). The varactor diode is coupled to the resonant element. The varactor diode is controlled by a first DC bias voltage. The first VVC has two fixed capacitance values corresponding to two fixed capacitance bias voltage ranges, coupled to the resonant element and the varactor diode. The first VVC is controlled by a second DC bias voltage selected to be within one of the two fixed capacitance bias voltage ranges to establish one of the two resonant frequency ranges over which the voltage controlled tunable resonant circuit is tuned by variation of the varactor diode. The voltage controlled tunable resonant circuit further includes a control circuit which is coupled to the varactor and the VVC and generates the first and second DC bias voltage. A largest average sensitivity of a capacitance of the VVC to voltage variations within the two fixed capacitance bias voltage ranges is substantially less than a maximum sensitivity of the capacitance of the VVC to voltage variations.

DETAILED DESCRIPTION OF THE INVENTION

Figure 1:
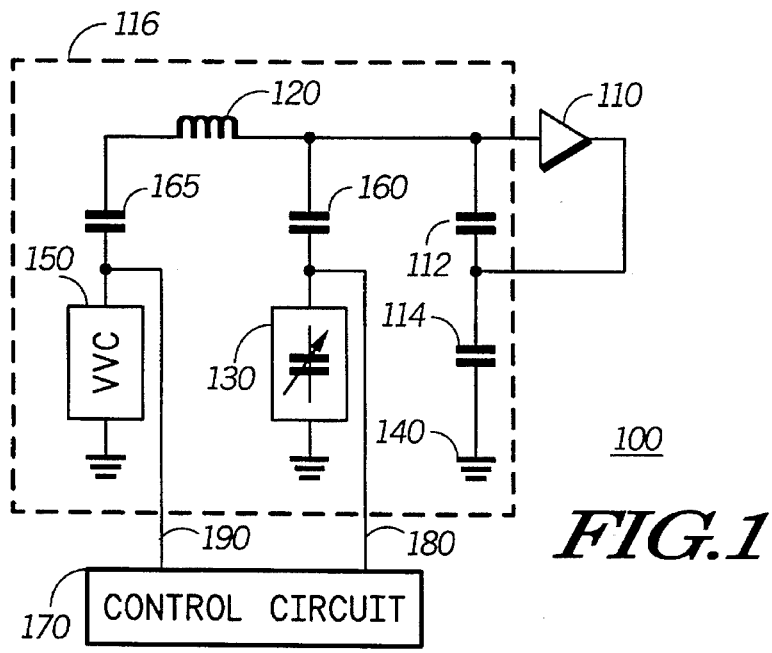
FIG. 1 is an electrical schematic of a dual range voltage controlled oscillator (VCO), in accordance with the preferred embodiment of the present invention.

Referring to FIG. 1, an electrical schematic of a dual range voltage controlled oscillator (VCO) 100 in a Colpitts configuration is shown, in accordance with the preferred embodiment of the present invention. The VCO 100 comprises an amplifier 110 having gain, coupled in parallel to a resonant circuit 116. The resonant circuit 116 comprises a feedback capacitor 112, a shunt capacitor 114, a circuit ground 140, a resonant element 120, a first DC blocking capacitor 165, a second DC blocking capacitor 160, a voltage variable capacitor (VVC) 150 and a variable reactance element which is preferably a variable capacitance element 130. The feedback capacitor 112 is coupled to an input terminal of the amplifier 110 and to an output terminal of the amplifier 110. The shunt capacitor 114 is coupled to the output terminal of the amplifier 110 and to the circuit ground 140. A first terminal of the resonant element 120 is coupled to the input terminal of the amplifier 110 and to a first terminal of the second DC blocking capacitor 160, and a second terminal of the resonant element 120 is coupled to a first terminal of the first DC blocking capacitor 165. A second terminal of the first DC blocking capacitor 165 is coupled to a first terminal of the VVC 150 and to a first DC bias voltage 190. A second terminal of the second DC blocking capacitor 160 is coupled to a first terminal of the variable capacitance element 130 and to a second DC bias voltage 180. A control circuit 170 provides the first DC bias voltage 190 and the second DC bias voltage 180. The reactance of the resonant element 120 is inductive and resonates with the reactance of the other elements of the resonant circuit 116 at a resonant frequency. A voltage oscillation is generated at the resonant frequency of the VCO 100, a portion of which voltage is impressed across the reactive elements 120, 150, 130, 112, 114, and the amplifier 110. The first DC bias voltage 190 selects one of two fixed capacitance values of the VVC 150. The second DC bias voltage 180 sets the capacitance of the variable capacitance element 130 within a range of capacitance of the variable capacitance element 130. The two fixed capacitance values of the VVC 150, selected by the first DC bias 190, in conjunction with the capacitance of the variable capacitance element 130 provide two resonant frequency ranges of the resonant circuit 116. The capacitance of the variable capacitance element 130, set by the second DC bias voltage 180, varies the resonant frequency of the resonant circuit 116 within the selected resonant frequency range. In the preferred embodiment of the present invention, the resonant element 120 is a wire inductor and the variable capacitance element 130 is a VVC. It will be appreciated that the resonant element 120 can alternatively be any two terminal element characterized by inductive reactance, such as a ceramic resonator.

Figure 2:
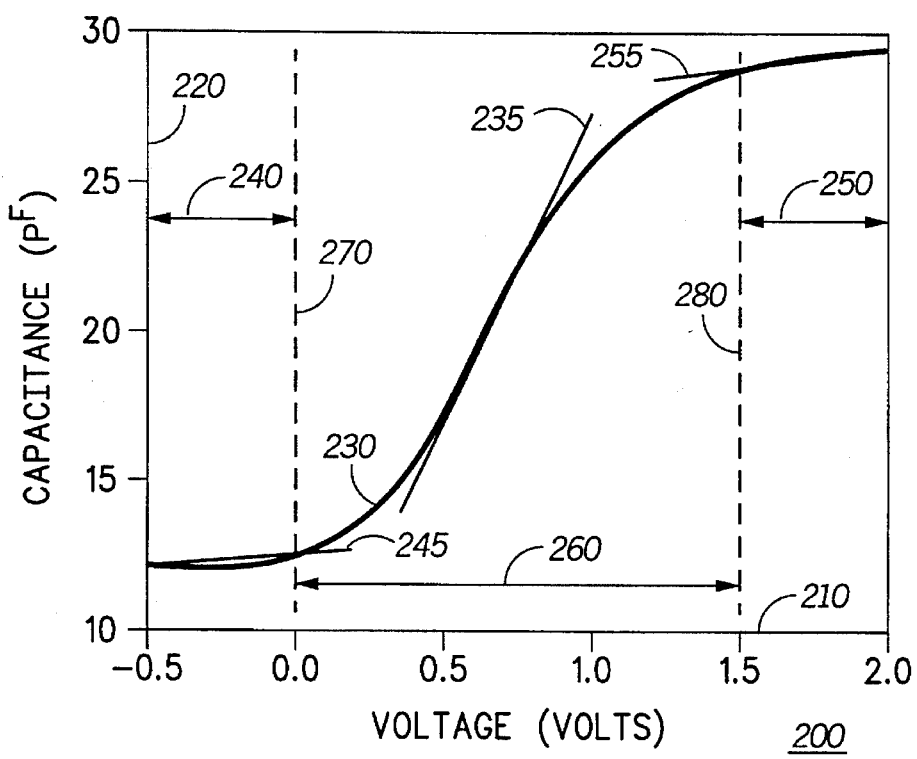
FIG. 2 is a graph showing characteristics of a voltage variable capacitor, in accordance with the preferred embodiment of the present invention.

Referring to FIG. 2, a graph 200 shows characteristics of the voltage variable capacitor (VVC) 150, in accordance with the preferred embodiment of the present invention. The physical implementation of a class of capacitors described as voltage variable capacitors (VVC's) is shown in U.S. Pat. No. 5,173,835 to Cornett et al., issued Dec. 22, 1992, which is incorporated herein by reference. A curve 230 shows the variation of the capacitance of the VVC 150 versus the first DC bias voltage 190 applied to the VVC 150. The value of the first DC bias voltage 190 is shown along a horizontal axis 210. The capacitance of the VVC 150 is shown along a vertical axis 220. A first dashed line 270 indicates a boundary between a lower fixed capacitance bias voltage range 240 and a variable capacitance bias voltage range 260. A second dashed line 280 indicates a boundary between the variable capacitance bias voltage range 260 and an upper fixed capacitance bias voltage range 250. An operational range of the VVC 150 consists of the fixed capacitance bias voltage ranges 240, 250 and the variable capacitance bias voltage range 260. When the DC bias voltage 190 is in the lower fixed capacitance bias voltage range 240, an average sensitivity of the capacitance of the VVC 150 to changes of the DC bias voltage 190, which is represented by the slope of a straight line 245, is approximately 1 picofarad per volt. The straight line 245 intersects the curve 230 at the limits of the range 240. When the DC bias voltage 190 is in the upper fixed capacitance bias voltage range 250, an average sensitivity of the capacitance of the VVC 150 to changes of the DC bias voltage 190, which is represented by the slope of a straight line 255, is also approximately 1 picofarad per volt. The straight line 255 intersects the curve 230 at the limits of the range 250. When the DC bias voltage 190 is in the variable capacitance bias voltage range 260, a maximum sensitivity of the capacitance of the VVC 150 to the DC bias voltage 190, which is the maximum slope of the curve 230, and which is represented by the slope of the line 235, is approximately 18 picofarads per volt.

Thus, there are two fixed capacitance bias voltage ranges within which the capacitance of the VVC 150 is substantially fixed, and a variable capacitance bias voltage range within which the capacitance of the VVC 150 changes from one of the substantially fixed capacitance values to the other substantially fixed capacitance value in response to a change of the DC bias voltage from one of the fixed capacitance bias voltage ranges to the other. It will be appreciated that the largest average sensitivity of the capacitance of the VVC 150 to the DC bias voltage 190 in the two fixed capacitance bias voltage ranges 240, 250 is less than one tenth of the maximum sensitivity in the variable capacitance range.

Referring again to FIG. 2, the graph 200 shows characteristics of the variable capacitance element 130 in the preferred embodiment of the present invention, wherein the variable capacitance element 130 is a VVC. In this case, the curve 230 shows the variation of the capacitance of the VVC 130 versus the DC bias voltage 180 applied to the VVC 130. The value of the DC bias voltage 180 is shown along the horizontal axis 210. The capacitance of the VVC 130 is shown along the vertical axis 220. The DC bias voltage 180 is controlled to be in the variable capacitance range 260, providing tuning in the two frequency ranges described above. It will be appreciated that the variable capacitance element 130 can alternatively be any other element characterized by capacitive reactance set by a DC bias, such as a varactor diode.

Figure 3:
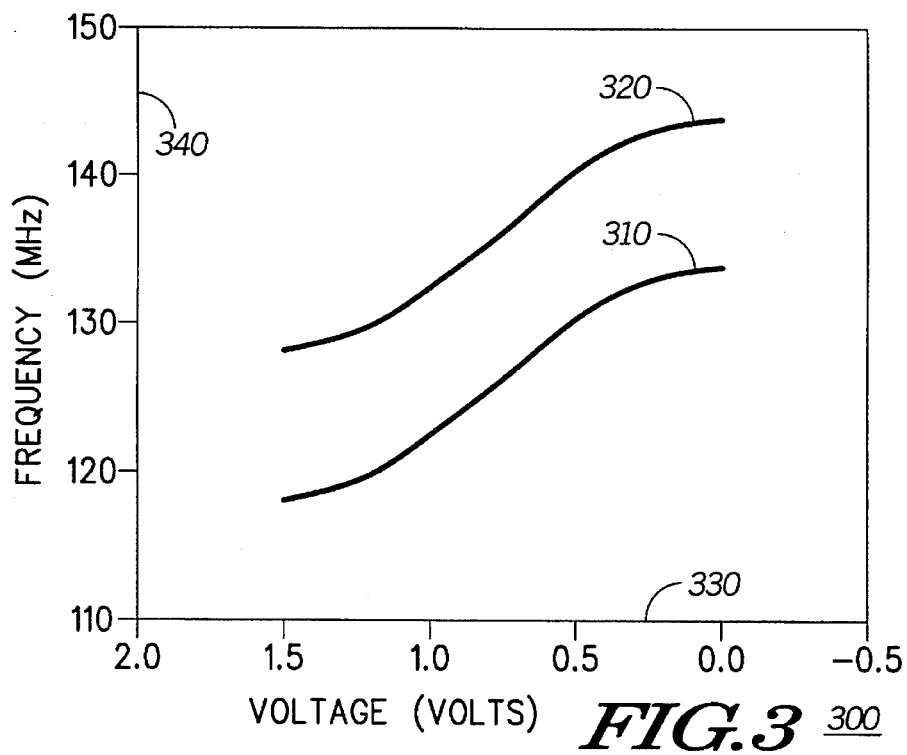
FIG. 3 is a graph showing characteristics of the dual range voltage controlled oscillator of FIG. 1, in accordance with the preferred embodiment of the present invention.

Referring to FIG. 3, a graph 300 shows characteristics of the dual range voltage controlled oscillator of FIG. 1, in accordance with the preferred embodiment of the present invention. The value of the second DC bias voltage 180 is shown along a horizontal axis 330. The resonant frequency value of the VCO 100 is shown along a vertical axis 340. A curve 310 shows the resonant frequency of the VCO 100 versus the second DC bias voltage 180, when the first DC bias voltage 190 is in the upper fixed capacitance voltage range 250. A curve 320 shows the resonant frequency of the VCO 100 versus the second DC bias voltage 180, when the first DC bias voltage 190 is in the lower fixed capacitance voltage range 240. It can be seen from the graph 300 that switching the first DC bias voltage 190 to one of the upper and lower fixed capacitance bias voltage ranges 240 and 250 of the VVC 150 selects one of two available frequency tuning ranges of the dual-range VCO 100. In this manner the dual range VCO 100 provides a tuning range from approximately 120 MHz to 140 MHz, which tuning range is available by switching the first DC bias voltage 190 and varying the control voltage 180 applied to the VVC 130. The VVCs 130 and 150 draw only leakage current from the first DC bias voltage 190.

Figure 4:
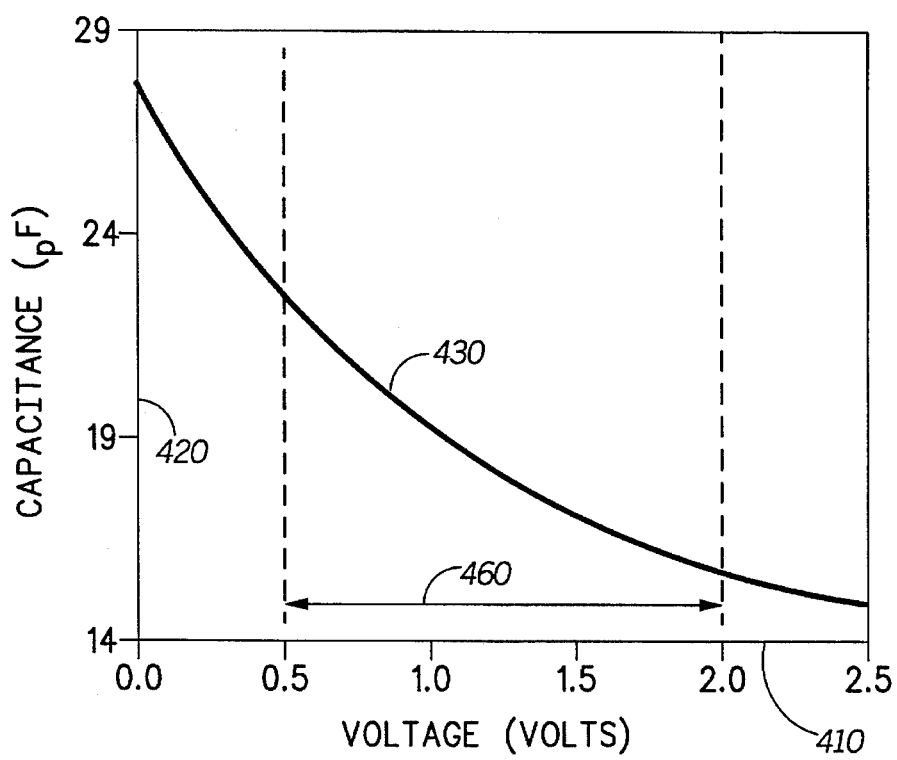
FIG. 4 is a graph showing characteristics of a varactor, in accordance with a first alternative embodiment of the present invention.

Referring to FIG. 4, a graph 400 shows characteristics of a varactor, in accordance with a first alternative embodiment of the present invention, wherein the variable capacitance element 130 is a conventional varactor. A curve 430 shows the variation of the capacitance of the varactor 130 versus the DC bias voltage 180 applied to the varactor 130. The value of the DC bias voltage 180 is shown along a horizontal axis 410. The capacitance of the varactor 130 is shown along a vertical axis 420. The DC bias voltage 180 is controlled to be in a variable capacitance range 460, providing tuning within the two frequency ranges as described above.

Figure 5:
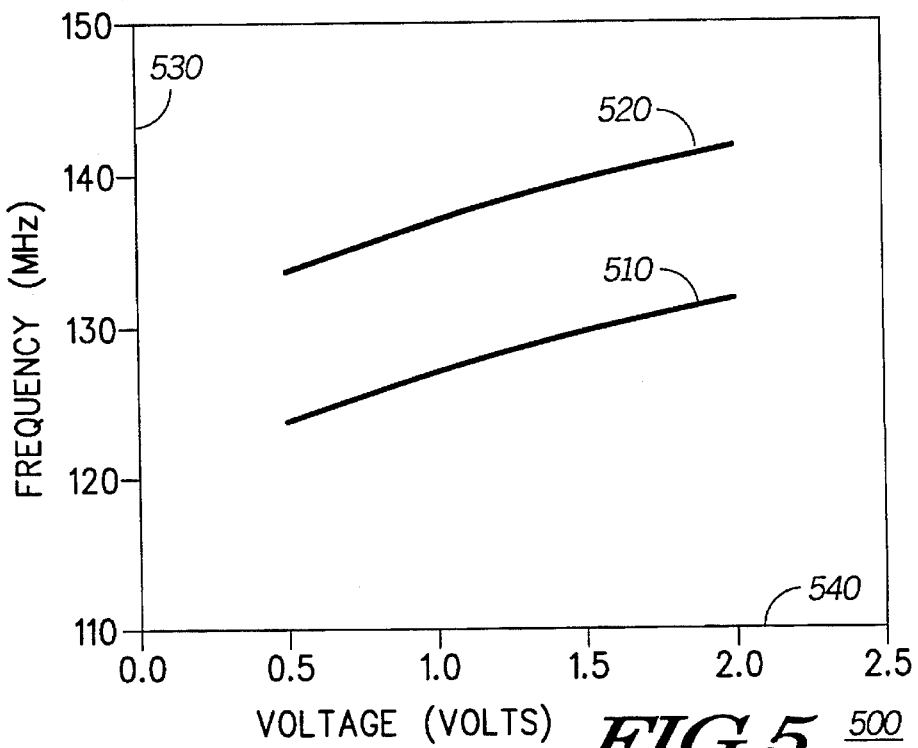
FIG. 5 is a graph showing characteristics of the dual range voltage controlled oscillator, in accordance with the first alternative embodiment of the present invention.

Referring to FIG. 5, a graph 500 shows the characteristics of the dual range voltage controlled oscillator of FIG. 1, in accordance with the first alternative embodiment of the present invention. The value of the second DC bias voltage 180 is shown along a horizontal axis 540. The resonant frequency value of the VCO 100 is shown along a vertical axis 530. A curve 510 shows the resonant frequency of the VCO 100 versus the second DC bias voltage 180, when the first DC bias voltage 190 is in the upper fixed capacitance voltage range 250. A curve 520 shows the resonant frequency of the VCO 100 versus the second DC bias voltage 180, when the first DC bias voltage 190 is in the lower fixed capacitance voltage range 240. It can be seen from the graph 500 that switching the first DC bias voltage 190 to one of the upper and lower fixed capacitance bias voltage ranges 240 and 250 of the VVC 150 selects one of two available resonant frequency tuning ranges of the dual range VCO 100. In this manner the dual range VCO 100 provides a tuning range from approximately 120 MHz to 140 Mhz, which tuning range is available by switching the first DC bias voltage 190 and varying the control voltage 180 applied to the varactor 130.

It will be appreciated that in the preferred and first alternative embodiments of the present invention, the unique use of the VVC 150 having two fixed capacitances in conjunction with the variable reactance element 130 reduces the range required for the reactance of the variable reactance element 130 in comparison to a conventional resonant circuit having a variable reactance element and no switched, fixed reactive element. The reduction of the required range of the variable reactance element 130 allows the use of a variable reactance element 130 having a smaller reactance change in response to changes of the control voltage 180 applied thereto, which results in a reduction of self modulation effects in comparison to those in the conventional resonant circuit having a variable reactance element without a switched, fixed reactive element. Self modulation is the undesirable variation of the reactance of the variable reactance element in response to the voltage oscillation which is generated in the VCO 100. Self modulation results in the generation of additional undesirable side-band noise by the VCO, in a manner well known to one of ordinary skill in the art.

It will be appreciated that other, prior art approaches to providing switched, fixed capacitance which involve the use of fixed value capacitors and PIN diodes have been used, but they typically require significantly more current, and they require more parts in comparison to the preferred embodiment of the present invention. The advantage of significantly less current drain and fewer parts is particularly desirable for very small devices such as pagers.

Figure 6:
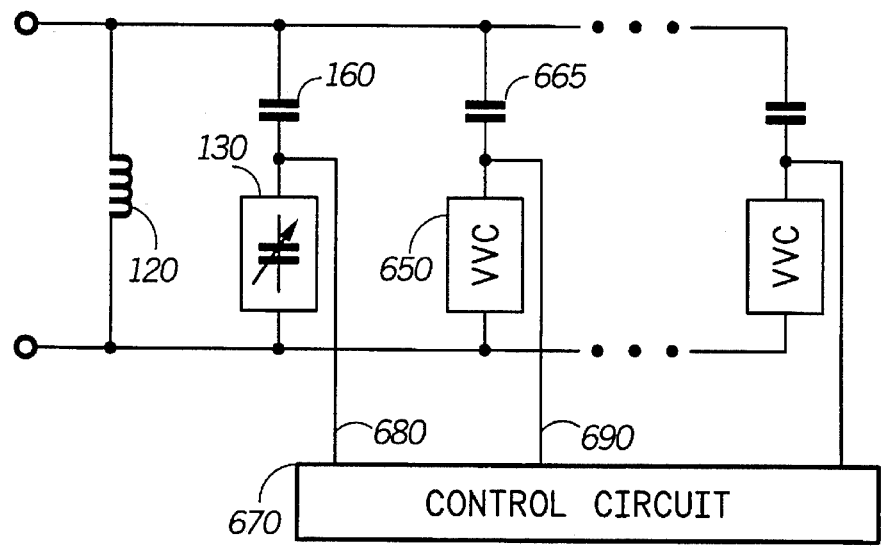
FIG. 6 is an electrical schematic of a multi-range resonant circuit, in accordance with a second alternative embodiment of the present invention.

Referring to FIG. 6, an electrical schematic of a multi-range resonant circuit 600 is shown, in accordance with a second alternative embodiment of the present invention. The multi-range resonant circuit 600 comprises the resonant element 120 coupled to a plurality of VVC's 650 and the variable capacitance element 130. Associated with each VVC 650 is a DC blocking capacitor 665 such that a unique fixed DC bias 690 can be applied to each VVC 650. Associated with the variable capacitance element 130 is a DC blocking capacitor 160 and a variable DC bias 680. The DC biases 680 and 690 are generated by a control circuit 670. The fixed DC biases 690 select one of two fixed capacitance values of each VVC 650. The variable DC bias 680 sets the capacitance of the variable capacitance element 130. Therefore, the fixed capacitances of the VVC's 650 select one of the resonant frequency ranges of the multi-range resonant circuit 600. The capacitance of the variable capacitance element 130, set by the variable DC bias 680, varies the resonant frequency of the multi-range resonant circuit 600 within the selected resonant frequency range. It will be appreciated that the multi-range resonant circuit 600 described herein is a band pass filter, but that many alternative circuit arrangements of reactive and resistive elements are possible which are well known to one of ordinary skill in the art, and which would result in other useful frequency filtering characteristics, and that the use therein of one or more VVC's, in conjunction with appropriate DC bias voltages would provide the same benefits for the alternative circuit arrangements as for the multi-range resonant circuit 600. Note that the multi-range resonant circuit 600 can be also used without a variable capacitance element 130, a configuration which is usable for selecting one of a predetermined plurality of resonant frequencies for a frequency filter or for a VCO of which the voltage controlled resonant circuit 600 forms a part.

Figure 7:
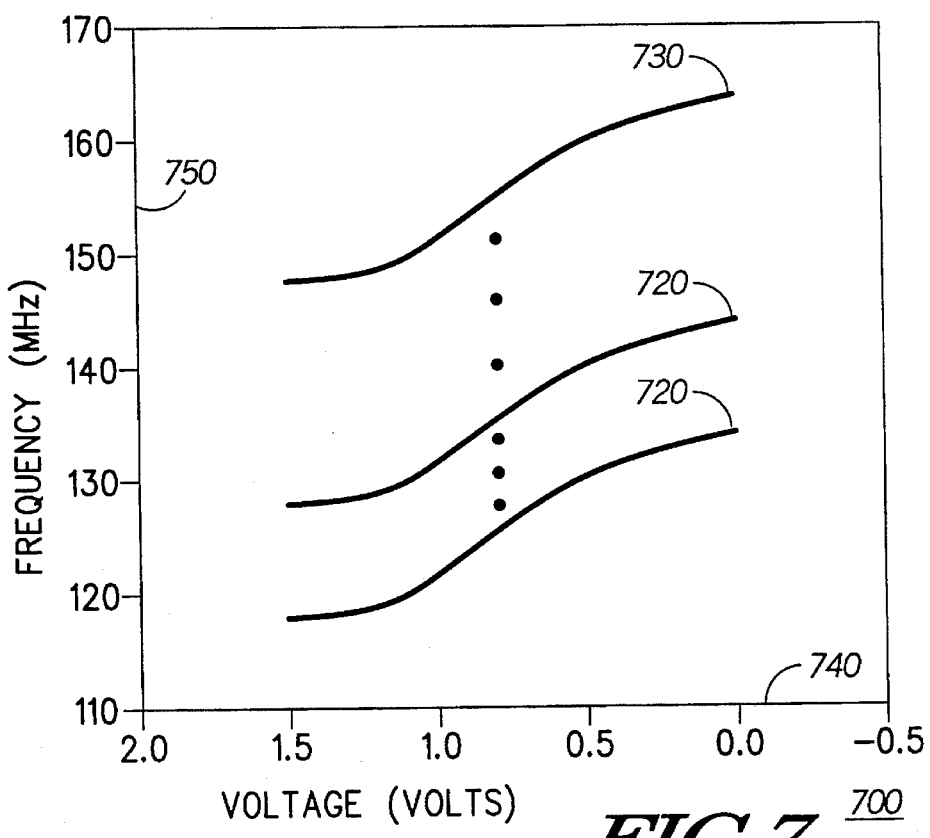
FIG. 7 is a graph showing the characteristics of the multi-range resonant circuit of FIG. 6, in accordance with the second alternative embodiment of the present invention.

Referring to FIG. 7, a graph 700 showing the characteristics of the multi-range resonant circuit 600 of FIG. 6 is shown, in accordance with the second alternative embodiment of the present invention. The value of the variable DC bias voltage 680 is shown along a horizontal axis 740. The resonant frequency value of the multi-range resonant circuit 600 is shown along a vertical axis 750. A curve 710 shows the resonant frequency of the multi-range resonant circuit 600 versus the variable DC bias 680, when all of the fixed DC biases 690 are in the upper fixed capacitance voltage ranges 250 of the VVC's 650. A curve 730 shows the resonant frequency of the multi-range resonant circuit 600 versus the variable DC bias 680, when all of the fixed DC biases 690 are in the lower fixed capacitance voltage ranges 240 of the VVC's 650. A curve 720 is representative of the resonant frequency of the multi-range resonant circuit 600 versus the variable DC bias 680, when some of the fixed DC biases 690 are in the lower fixed capacitance voltage ranges 240 of the VVC's 650 and the remaining fixed DC biases 690 are in the upper fixed capacitance voltage ranges 250 of the VVC's 650.

Figure 8:
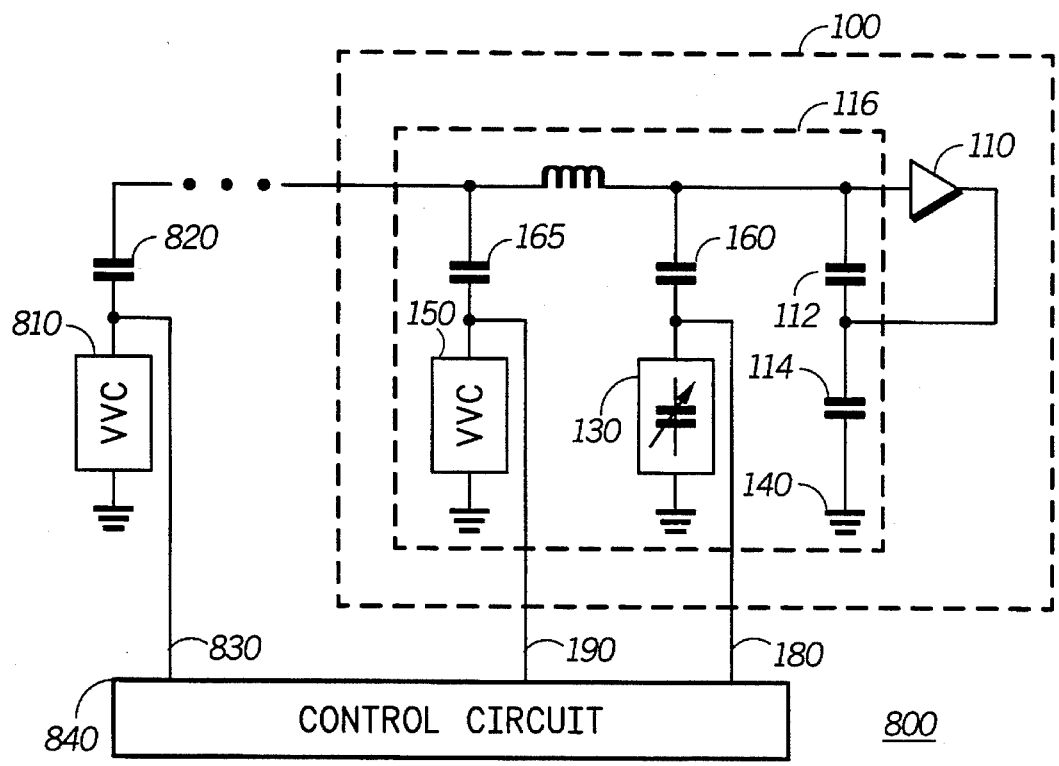
FIG. 8 is an electrical schematic of a multi-range voltage controlled oscillator, in accordance with a third alternative embodiment of the present invention.

Referring to FIG. 8, an electrical schematic of a multi-range voltage controlled oscillator 800 is shown, in accordance with a third alternative embodiment of the present invention. The multi-range voltage controlled oscillator 800 comprises the dual range VCO 100, a plurality of VVC's 810 and a plurality of DC blocking capacitors 820. Associated with each of the plurality of VVC's 810 is one of the DC blocking capacitors 820 such that a unique fixed DC bias 830 can be applied to each VVC 810. The DC biases 180, 190 and 830 are generated by a control circuit 840. The fixed DC biases 190, 830 select one of two fixed capacitance values of each of the VVC's 150, 810. The variable DC bias voltage 180 sets the capacitance of the variable capacitance element 130. Therefore, the fixed capacitances of the VVC's 150 and 810 select one of the resonant frequency ranges of the multi-range VCO 800. The set capacitance of the variable capacitance element 130 establishes the resonant frequency of the multi-range VCO 800 within the selected VCO frequency range.

It will be appreciated that in the second and third alternative embodiments of the present invention described with reference to FIG. 6, FIG. 7, and FIG. 8, the unique use of multiple VVC's, each of which has two fixed capacitances, in conjunction with the variable reactance element 130, further reduces the range required for the reactance of the variable reactance element 130 in comparison to a resonant circuit having a variable reactance element and fewer switched, fixed reactive element, for the reasons given above. Approaches involving fixed value capacitors and PIN diodes to provide switched fixed capacitances have been uses in prior art, but they typically have required significant additional current and significant additional parts in comparison to the second and third alternative embodiments in accordance with the present invention.

Figure 9:
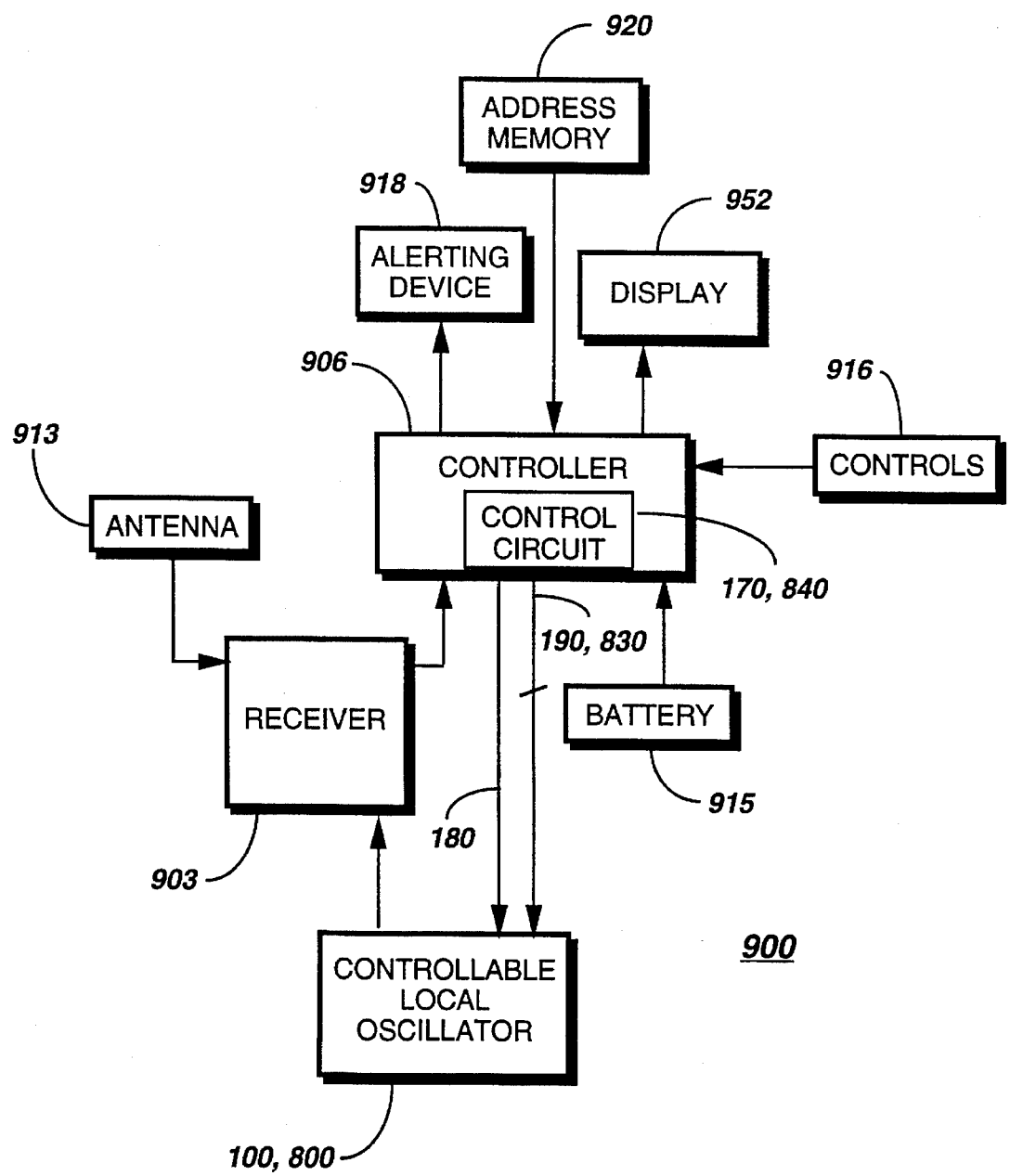
FIG. 9 is an electrical block diagram of a selective call receiver, in which the voltage controlled oscillator of FIG. 1 is suitable for use, in accordance with the preferred embodiment of the present invention.

Referring to FIG. 9, an electrical block diagram is shown of a selective call receiver 900, in accordance with the preferred and third alternative embodiments of the present invention. The selective call receiver 900 operates to intercept a radio signal via an antenna 913, which is coupled to a receiver 903. The receiver 903 operates to filter, convert, and demodulate the received digital radio signal and couples the demodulated radio signal to a controller 906, comprising control logic for decoding and recovering a selective call message contained within the signal, in a manner well known in the art. The selective call message includes an address and may include other information such as a telephone number, alphanumeric data, or graphics. An address memory 920 which stores a predetermined address is coupled to the controller 906. The controller 906 is coupled to a battery 915, for distributing power from the battery 915 to other circuits in the selective call receiver 900, including the receiver 903. The controller 906 is further coupled to operator controls 916, a display 952, and a sensible alerting device 918. The controller 906 compares the address recovered from the selective call message to the predetermined address stored in the address memory 920 and continues processing the message when the comparison meets predetermined criteria. When the comparison does not meet predetermined criteria, the controller 906 stops the processing of the selective call message. A local oscillator signal is generated by the controllable local oscillator, which is preferably the dual range voltage controlled oscillator 100. The local oscillator signal is coupled to the receiver 903 and used therein for performing a frequency conversion of the received signal. The control circuit 170, which is a portion of the controller 906, generates the DC bias voltages 180 and 190 for setting the resonant frequency of the VCO 100. As determined by the contents of the recovered selective call message and the settings of operator controls 916, the selective call receiver 900 may further process a selective call message by presenting at least a portion of the selective call message, using the display 952, and by signaling the user via the sensible alerting device 918 that a selective call message has been received. The information which is displayed can include a short message such as a phone number or a longer message such as a alphanumeric inquiry or a small map, any of which can be presented on the display 952 by manipulation of the operator controls 916 on the selective call receiver 900.

It will be appreciated that the controllable local oscillator could alternatively be the multi-range VCO 800, having a plurality of resonant frequency ranges controlled by the plurality of DC bias control voltages 190, 830 which are generated by the control circuit 840. It will be further appreciated that the selective call receiver 900 could be of the type which also transmits messages by means of radio signals.

The selective call receiver 900 is preferably similar to a Memo Express® model pager, manufactured by Motorola, Inc., of Schaumburg, Ill., but may alternatively may be another selective call receiver radio, modified to use the dual range VCO 100 or multi-range VCO 800. The controller 906 in the Memo Express® model pager is a microprocessor of the model 68HC05 family of microprocessors manufactured. This is the preferred implementation of the controller 906 and the control circuits 170, 670, 840, but alternative microprocessors or integrated logic circuits may also be used.

The selective call receiver 900 is representative of many other portable and mobile devices which include controlled frequency circuits that can benefit from the present invention. Examples of such other portable and mobile devices are portable telephones, portable tape recorders, portable compact disc players, and portable broadcast communication receivers.

It will be appreciated that the multi-range VCO 800 may be used instead of or in addition to the dual range VCO 100 in radios or other devices using controlled resonant frequency circuits and that the multi-range resonant circuit 600 may also be used in radios or other devices requiring voltage controlled tunable resonant circuits.

By now it should be appreciated that there has been provided a unique resonant circuit and voltage controlled oscillator which are tunable over a wide frequency range with reduced side-band noise, reduced current drain, and reduced number of parts.

We claim:

1. A voltage controlled tunable resonant circuit having at least two resonant frequency ranges and reduced self modulation, comprising:

a resonant element;

a varactor diode, capacitively coupled to resonate with said resonant element, which varactor diode is controlled by a first DC bias voltage; and a first voltage variable capacitor (VVC) having two fixed capacitance values corresponding to two fixed capacitance bias voltage ranges, capacitively coupled to resonate with said resonant element and said varactor diode, and wherein said first VVC is controlled by a second DC bias voltage selected to be within one of the two fixed capacitance bias voltage ranges to establish one of the two resonant frequency ranges over which the voltage controlled tunable resonant circuit is tuned by variation of said varactor diode, and wherein the voltage controlled tunable resonant circuit further comprises a control circuit, coupled to said varactor and said VVC, which control circuit generates the first and second DC bias voltage, and wherein a largest average sensitivity of a capacitance of said VVC to voltage variations within the two fixed capacitance bias voltage ranges is substantially less than a maximum sensitivity of the capacitance of said VVC to voltage variations.

2. A voltage controlled tunable resonant circuit having at least two resonant frequency ranges and reduced self modulation, comprising:

a resonant element;

a first and a second voltage variable capacitors (VVC), each having two fixed capacitance values corresponding to two fixed capacitance bias voltage ranges, and each being capacitively coupled to resonate with said resonant element;

wherein said first VVC is controlled by a first DC bias voltage selected to be within one of the two fixed capacitance bias voltage ranges to establish one of the two resonant frequency ranges over which the voltage controlled tunable resonant circuit is tuned by setting a second DC bias voltage between the two fixed capacitance bias voltage ranges of said second VVC.

3. A voltage controlled tunable resonant circuit having at least two resonant frequency ranges and reduced self modulation, comprising:

a resonant element;

a variable reactance element, capacitively coupled to said resonant element;

a first voltage variable capacitor (VVC) having two fixed capacitance values corresponding to two fixed capacitance bias voltage ranges, capacitively coupled to resonate with said resonant element and said variable reactance element; and one or more additional VVC's, each having two fixed capacitance values corresponding to two fixed capacitance bias voltage ranges, and each capacitively coupled to resonate with said resonant element and said variable reactance element, wherein said first VVC is controlled by a first DC bias voltage selected to be within one of the two fixed capacitance bias voltage ranges to establish one of the two resonant frequency ranges over which the voltage controlled tunable resonant circuit is tuned by variation of said variable reactance, and wherein each of said one or more additional VVC's is controlled by a DC bias voltage selected to be within one of the two fixed capacitance bias voltage ranges to establish one of the at least two resonant frequency ranges over which the voltage controlled tunable resonant circuit is tuned by variation of said variable reactance element.

4. A voltage controlled tunable resonant circuit having at least two resonant frequency ranges and reduced self modulation, comprising:

a resonant element;

a variable reactance element, capacitively coupled to resonate with said resonant element; and a first voltage variable capacitor (VVC) having two fixed capacitance values corresponding to two fixed capacitance bias voltage ranges, coupled to resonate with said resonant element and said variable reactance element, wherein said first VVC is controlled by a first DC bias voltage selected to be within one of the two fixed capacitance bias voltage ranges to establish one of the two resonant frequency ranges over which the voltage controlled tunable resonant circuit is tuned by variation of said variable reactance element, and wherein a largest average sensitivity of a capacitance of said first VVC to voltage variations within the two fixed capacitance bias voltage ranges is substantially less than a maximum sensitivity of the capacitance of said first VVC to voltage variations.

5. A selective call receiver for receiving a radio signal which includes an address, the selective call receiver comprising:

a receiver element for receiving and demodulating the radio signal, including the address;

a controller, coupled to said receiver element, for comparing the address received in the radio signal with a predetermined address stored in said selective call receiver;

a sensible alert, coupled and responsive to said controller, for presenting an alert indication when the address compares to the predetermined address, wherein at least a portion of said receiver element and said controller comprises a voltage controlled oscillator circuit operable within two or more resonant frequency ranges and having reduced self modulation, comprising:

an amplifier having gain; and a voltage controlled tunable resonant circuit having at least two resonant frequency ranges and reduced self modulation, comprising:

a resonant element;

a first and a second voltage variable capacitors (VVC), each having two fixed capacitance values corresponding to two fixed capacitance bias voltage ranges, and each being capacitively coupled to resonate with said resonant element;

wherein said first VVC is controlled by a first DC bias voltage selected to be within one of the two fixed capacitance bias voltage ranges to establish one of the two resonant frequency ranges over which the voltage controlled tunable resonant circuit is tuned by setting a second DC bias voltage between the two fixed capacitance bias voltage ranges of said second VVC.

6. A selective call receiver for receiving a radio signal which includes an address, the selective call receiver comprising:

a receiver element for receiving and demodulating the radio signal, including the address;

a controller, coupled to said receiver element, for comparing the address received in the radio signal with a predetermined address stored in said selective call receiver;

a sensible alert, coupled and responsive to said controller, for presenting an alert indication when the address compares to the predetermined address, wherein at least a portion of said receiver element and said controller comprises a voltage controlled oscillator circuit operable within two or more resonant frequency ranges and having reduced self modulation, comprising:

an amplifier having gain; and a voltage controlled tunable resonant circuit having at least two resonant frequency ranges and reduced self modulation, comprising:

a resonant element;

a variable reactance element, capacitively coupled to resonate with said resonant element;

a first voltage variable capacitor (VVC) having two fixed capacitance values corresponding to two fixed capacitance bias voltage ranges, capacitively coupled to resonate with said resonant element and said variable reactance element; and one or more additional VVC's, each having two fixed capacitance values corresponding to two fixed capacitance bias voltage ranges, each being capacitively coupled to resonate with said resonant element and said variable reactance element, and wherein said first VVC is controlled by a first DC bias voltage selected to be within one of the two fixed capacitance bias voltage ranges to establish one of the two resonant frequency ranges over which the voltage controlled tunable resonant circuit is tuned by variation of said variable reactance, and wherein each of said one or more additional VVC's is controlled by a DC bias voltage selected to be within one of the two fixed capacitance bias voltage ranges to establish one of the at least two resonant frequency ranges over which the voltage controlled tunable resonant circuit is tuned by variation of said variable reactance element.

7. A selective call receiver for receiving a radio signal which includes an address, the selective call receiver comprising:

a receiver element for receiving and demodulating the radio signal, including the address;

a controller, coupled to said receiver element, for comparing the address received in the radio signal with a predetermined address stored in said selective call receiver;

a sensible alert, coupled and responsive to said controller, for presenting an alert indication when the address compares to the predetermined address, wherein at least a portion of said receiver element and said controller comprises a voltage controlled oscillator circuit operable within two or more resonant frequency ranges and having reduced self modulation, comprising:

an amplifier having gain; and a voltage controlled tunable resonant circuit having at least two resonant frequency ranges and reduced self modulation, comprising:

a resonant element;

a variable reactance element, capacitively coupled to resonate with said resonant element; and a first voltage variable capacitor (VVC) having two fixed capacitance values corresponding to two fixed capacitance bias voltage ranges, capacitively coupled to resonate with said resonant element and said variable reactance element, and wherein said first VVC is controlled by a first DC bias voltage selected to be within one of the two fixed capacitance bias voltage ranges to establish one of the two resonant frequency ranges over which the voltage controlled tunable resonant circuit is tuned by variation of said variable reactance element, and wherein a largest average sensitivity of a capacitance of said first VVC to voltage variations within the two fixed capacitance bias voltage ranges is substantially less than a maximum sensitivity of the capacitance of said first VVC to voltage variations.

* * * * *